United States Patent [19]

Ushida et al.

[11] Patent Number: 5,662,776
[45] Date of Patent: Sep. 2, 1997

[54] GLASS FIBER NON-WOVEN FABRIC, A METHOD OF PRODUCING GLASS FIBER NON-WOVEN FABRIC AND A METHOD OF PRODUCING A LAMINATE

[75] Inventors: Masayuki Ushida, Anzyo; Masaru Ogata, Shiga-ken; Akihiro Hachiya, Hikone; Yukihiro Yamashita, Ohmihachiman; Masayuki Noda, Hikone, all of Japan

[73] Assignee: Shin-Kobe Electric Machinery Co., Tokyo, Japan

[21] Appl. No.: 289,245

[22] Filed: Aug. 11, 1994

[30] Foreign Application Priority Data

Aug. 24, 1993 [JP] Japan .................... 5-209289

[51] Int. Cl.$^6$ .................... D04H 1/58; D04H 1/42; B32B 17/04

[52] U.S. Cl. .................... 162/156; 162/145; 162/164.3; 65/448; 65/450; 65/453; 156/330; 156/314; 156/307.3; 442/327; 442/391

[58] Field of Search .................... 162/156, 164.5, 162/164.3, 145; 65/448, 450, 453; 428/224, 143, 283, 273, 228; 156/330, 314, 307.3, 307.4, 307.5

[56] References Cited

U.S. PATENT DOCUMENTS

| | | | |
|---|---|---|---|
| 3,211,684 | 10/1965 | Eakins | 156/330 X |
| 3,718,448 | 2/1973 | Drummond et al. | 65/3 |
| 3,769,126 | 10/1973 | Kolek | 156/172 |
| 3,803,069 | 4/1974 | McWilliams et al. | 260/29.2 |
| 3,955,036 | 5/1976 | Plueddemann | 428/429 |
| 3,981,851 | 9/1976 | Plueddemann | 526/267 |
| 4,244,844 | 1/1981 | Molinier et al. | 260/9 |
| 4,474,685 | 10/1984 | Annis | 252/503 |
| 4,871,376 | 10/1989 | DeWald | 51/298 |
| 4,910,077 | 3/1990 | Benedikt | 428/251 |
| 5,328,566 | 7/1994 | Yokoyama et al. | 162/152 |

FOREIGN PATENT DOCUMENTS 144339  7/1986  Japan ............... B32B 15/08

*Primary Examiner*—Donald E. Czaja
*Assistant Examiner*—Jose A. Fortuna
*Attorney, Agent, or Firm*—Pearne, Gordon, McCoy & Granger LLP

[57] ABSTRACT

Glass fiber non-woven fabric for base material of a laminate comprising binder binding glass fibers to each other, said binder including a reactant product formed by reacting a solution of tri-functional epoxy resin, bi-functional epoxy resin and tri-ethylene tetramine and having an acetic solution and phenyl amino-silane coupling agent added thereto. The thus obtained glass fiber non-woven fabric is impregnated with an predetermined amount of epoxy resin and dried to produce prepregs, which are superposed one upon another and formed under heat and pressure of 20 kgf/cm$^2$ to produce the laminate.

5 Claims, 3 Drawing Sheets

GLASS FIBER NON-WOVEN FABRIC, A METHOD OF PRODUCING GLASS FIBER NON-WOVEN FABRIC AND A METHOD OF PRODUCING A LAMINATE

BACKGROUND OF THE INVENTION

This invention pertains to electrically insulating laminate, glass fiber non-woven fabric for base material of the laminate and a method of producing the glass fiber non-woven fabric and the laminate.

Of late, as a printed wiring board has a circuit of high density, a laminate for an insulating board of the printed wiring board is required to have an improved electrical insulation. The laminate has been produced by impregnating the sheet-like base material with thermosetting resin and forming them under heat and under pressure. The glass fiber non-woven fabric before impregnated with thermosetting resin has glass fibers bound by binder.

Glass fiber non-woven fabric has been formed by dispersing glass fibers of predetermined diameter and length in water and paper-making it to produce a web, which has binder attached thereto and dried and cured.

The binder has been conventionally produced as follows, for example. 1,2 epoxide compound having more than two oxilane functions included in a molecule and having epoxy equivalents of 170 through 1000 is reacted with water-soluble polyamine compound having more than at least one active hydrogen bound with nitrogen atom at a ratio of more than ¼ of the active hydrogen in the water-soluble polyamine compound relative to one epoxy function in the epoxide compound. The thus obtained product has an acid added thereto to induce water-soluble or water-dispersed amine-epoxide acid salt which is quickly cured under heat. The epoxide compound is of multi-functional epoxy resin including much component having epoxy function of three, four or more than four.

Since the laminate, which has the base material formed by using glass fiber non-woven fabric, has poor electrical insulation, the binder is blended with coupling agent of epoxy-silane in order to improve the electrical insulation, which is disclosed in Japanese Patent Application Laying-Open No. 82741/1988.

However, in the prior art where the binder is blended with coupling agent of epoxy-silane, the laminate cannot have electrical insulation between small distance at which the circuits of the printed circuit board are spaced to each other or at which through-holes are spaced to each other.

SUMMARY OF THE INVENTION

A principal object of the invention is to provide glass fiber non-woven fabric used for a thermosetting resin laminate having more excellent electrical insulation.

Another object of the invention is to provide glass fiber non-woven fabric used for a thermosetting resin laminate having an anti-migration between adjacent through-holes or circuits on the printed circuit board.

Further object of the invention is to provide a method of producing a thermosetting resin laminate having more excellent electrical insulation.

Further object of the invention is to provide a method of producing a thermosetting resin laminate having an anti-migration between adjacent through-holes or circuits on the printed circuit board.

In accordance with one aspect of the invention, there is provided glass fiber non-woven fabric for thermosetting resin laminate comprising glass fibers bound to each other by epoxy binder including phenyl amino-silane.

In accordance with another aspect of the invention, there is provided a method of producing glass fiber non-woven fabric for a thermosetting resin laminate having glass fibers bound to each other by binder comprising a reactant product of epoxy resin and aliphatic amine having an acid added thereto, characterized by using as said epoxy resin both of bi-functional epoxy resin and tri-functional epoxy resin and blending said binder with phenyl amino-silane.

In accordance with further aspect of the invention, there is provided a method of producing a laminate comprising the steps of preparing a multi-layer of sheet-like base materials, impregnating said multi-layer of sheet-like base materials with thermosetting resin and thereafter forming said multi-layer of sheet-like base materials under heat and under pressure, said method characterized by at least one portion of said sheet-like base materials comprising glass fibers bound to each other by epoxy binder including phenyl amino-silane.

In accordance with further aspect of the invention, there is provided a method of producing a laminate comprising the steps of forming glass fiber non-woven fabric by binding glass fibers to each other by binder comprising a reactant product of epoxy resin and aliphatic amine having an acid added thereto, preparing prepreg by impregnating said glass fiber non-woven fabric with thermosetting resin and drying them and forming under heat and under pressure a multi-layer of prepregs, at least one of which is one prepared by said aforementioned step, said method characterized in that said step of preparing said glass fiber non-woven fabric including the steps of using as said epoxy resin both of bi-functional epoxy resin and tri-functional epoxy resin and blending said binder with phenyl amino-silane.

Since silane coupling agent serves to improve adherence of the glass fibers to the thermosetting resin with which the glass fiber non-woven fabric is impregnated during producing the laminate, which makes it difficult to intrude water onto an interface between the glass fibers and the thermosetting resin. Thus, it will be noted that the thus produced laminate can have the electrical insulation more improved.

Furthermore, phenyl radical of phenyl amino-silane has more affinity to the epoxy binder than epoxy radical of the epoxy silane conventionally used therein. Thus, it will be noted that adherence of the glass fibers to the binder is more improved, which causes the laminate to have more improved electrical insulation.

Use of both of bi-functional and tri-functional epoxy resins for the binder causes a distribution of molecular weight of the epoxy resin to be relatively narrower, which is substantially different from the conventional binder using poly-functional epoxy resin such as phenol novolack epoxy resin having a wider distribution of molecular weight thereof. Such narrower distribution of molecular weight of the epoxy resin causes the electrical insulation to be more improved although it has not been explicated why such excellent electrical insulation is accomplished.

According to our inference, since use of both of bi-functional and tri-functional epoxy resins having the narrowed distribution of molecular weight during producing binder causes epoxy resin to react with alphatic amine in a more uniform manner, the binder has better quality when they bind glass fibers to each other. It is considered that this causes the laminate including glass fiber non-woven fabric produced by such binder to have the electrical insulation more improved.

BRIEF DESCRIPTION OF THE DRAWINGS

The above and other objects and features of the invention will be apparent from the description of the embodiments of the invention taken along with reference to the accompanying drawings in which.

DETAILED DESCRIPTION OF THE EMBODIMENTS

Figure 1:
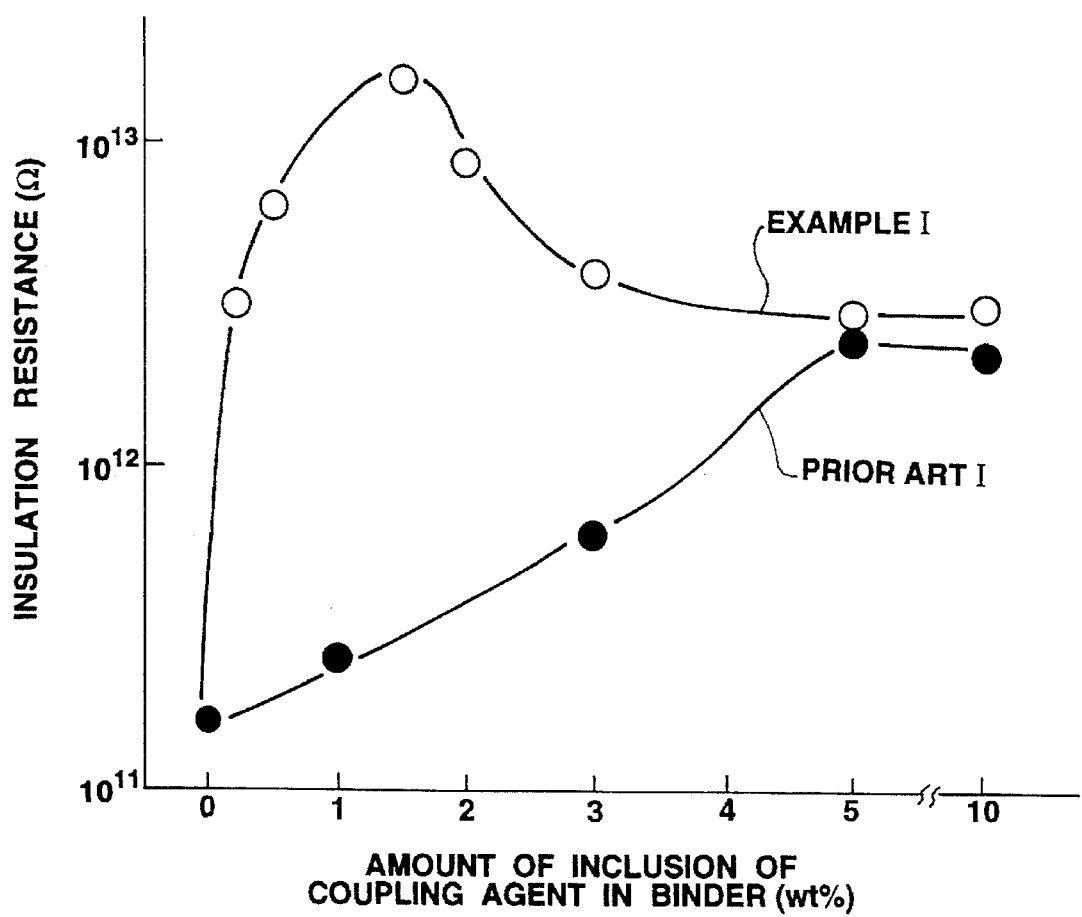
FIG. 1 illustrates in plot including curves an electrical insulation of laminates relative to an amount of inclusion of coupling agent in epoxy binders for glass fiber non-woven fabrics which were used for producing the laminates.

Some of examples of the invention and some prior arts are described hereinafter.

EXAMPLE I

Glass fibers were paper-made into webs which have epoxy binders adhered thereto. The epoxy resin for the epoxy binders was poly-functional epoxy resin of phenol novolac type which has been manufactured by TOHTO KASEI Co., Ltd., Japan and available therefrom under the tradename of YDPN-63. This has about 48 capacity % of component having more than five epoxy radicals included in one molecule. This also has about 25 capacity % of component having two epoxy radicals included in one molecule, about 16 capacity % of component having three epoxy radicals included in one molecule and about 11 capacity % of component having four epoxy radicals included in one molecule.

Alphatic amine which should react with the epoxy resin may be straight chain alphatic amine. Water soluble polyamine such as diethylene-triamine, triethylene-tetramine or the like may be used. In the following Example, triethylene-tetramine (referred to as TETA hereinafter) was used.

The epoxy binders had coupling agent of phenyl amino-silane included therein. The phenyl amino-silane used was one manufactured by Nippon Yunikaa under the tradename of Y-9138, for example, which is expressed by the following chemical formula (1).

$$C_6H_5CH_2N^+H_2C_2H_4NHC_3H_6Si(OCH_3)_3Cl^- \quad (1)$$

To 6000 weight parts of poly-functional epoxy resin "YDPN-638", 816 weight parts of TETA were added a predetermined amount of solvent and they were reacted with each other for predetermined hours while fully agitated. To the reactant product are added 36352 weight parts of 3.7 weight % acetic acid solution and 13.6through 682 weight parts (0.2 through 10 weight %) of coupling agent "Y-9138" to produce about 45 kg of binders having about 15 weight % of solid component. The following Table shows the relation of the weight % of the coupling agent and the corresponding weight parts thereof with the weight % of the solid components of the produced binders and the total weight of the binders.

| Y-9138 weight % | Y-9138 weight parts | solid component of binder weight % | binder total weight Kg |
| --- | --- | --- | --- |
| 0.2 | 13.6 | 15.0 | 45.454 |
| 0.5 | 34.1 | 15.1 | 45.474 |
| 1.5 | 101 | 15.2 | 45.541 |
| 2 | 136 | 15.3 | 45.576 |
| 3 | 204 | 15.4 | 45.644 |
| 5 | 341 | 15.6 | 45.781 |
| 10 | 682 | 16.3 | 46.122 |

An amount of use of the epoxy binders was 11 weight %. The webs were dried and cured to make glass fiber non-woven fabric having a unit weight of 70 g/m².

The thus obtained glass fiber non-woven fabric was impregnated with epoxy resin to form prepreg. Predetermined numbers of prepregs were placed one upon another and formed under pressure of 20 kgf/cm² at a temperature of 160° C. for an hour to produce a laminate having a thickness of 1.2 mm.

PRIOR ART I

Webs were prepared by paper-making glass fibers in the same manner as EXAMPLE I and had epoxy binder adhered thereto. The epoxy binder had coupling agent of epoxy silane included therein, which was one manufactured by Nippon Unikaa under the tradename of A-187, which is expressed by the following chemical formula (2).

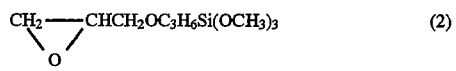

$$\underset{O}{CH_2\text{———}CH}CH_2OC_3H_6Si(OCH_3)_3 \quad (2)$$

An amount of inclusion of epoxy silane was 0 through 10 weight % while an amount of use of the epoxy binder was 11 weight %.

The webs were dried and cured to make glass fiber non-woven fabric having a unit weight of 70 g/m².

A laminate of 1.2 mm thickness was produced by using the thus obtained glass fiber non-woven fabric in the same manner as Example I.

COMPARISON OF EXAMPLE I AND PRIOR ART I

Samples of Example I and Prior Art I were provided to a pressure cooker process, which was made under pressure of 1 atm at a temperature of 121° C. for 24 hours. The result was shown in FIG. 1. It will be noted from FIG. 1 that samples of Example I have insulation characteristic more excellent than those of Prior Art I at the smaller amount of inclusion of coupling agent. It will be also noted that 0.5 through 3 weight % of coupling agent is preferably used for the epoxy binder because of provision of more excellent electrical insulation of the laminate.

BINDER USED FOR EXAMPLES II AND III AND PRIOR ART II

The epoxy resin used for binders of Examples II and III and Prior Art II which will be described later was one which is described hereinafter.

Bi-functional epoxy resin was of bis-phenol A type which has been manufactured by YUKA SHELL Co., Ltd., Japan and available therefrom under the tradename of EP-828EL. This has about 80 capacity % of component having two epoxy radicals included in one molecule. This also has component having more than three epoxy radicals included in one molecule.

Tri-functional epoxy resin was of glycygylized tris-phenylole methane type which has been manufactured by MITSUI OIL CHEMICAL Co., Ltd., Japan and available therefrom under the tradename of VG-3101. This has about 86 capacity % of component having three epoxy radicals included in one molecule. This also has component having more than four epoxy radicals included in one molecule.

Poly-functional epoxy resin was of phenol novolac type which has been manufactured by TOHTO KASEI Co., Ltd., Japan and available therefrom under the tradename of YDPN-638. This has about 48 capacity % of component having more than five epoxy radicals included in one molecule. This also has about 25 capacity % of component having two epoxy radicals included in one molecule, about 16 capacity % of component having three epoxy radicals included in one molecule and about 11 capacity % of component having four epoxy radicals included in one molecule.

Aliphatic amine which should react with the epoxy resin may be straight chain alphatic amine. Water soluble polyamine such as diethylene-triamine, triethylene-tetramine or the like may be used. In the following Example, triethylene-tetramine (referred to as TETA hereinafter) was used.

Solvent for controlling reaction of epoxy resin with alphatic amine may be of any type except for alcohol such as methanol which is reactive with epoxy resin.

Acid to be added to a reactant product of epoxy resin and aliphatic amine may be organic acid such as formic acid and acetic acid having no harm to human body during drying step of binder which is to bind glass fibers to each other, but it is not limited thereto.

Coupling agent and epoxysilane were Y-9138 and A-187 which were used in Example I and Prior Art I, respectively.

EXAMPLE II

To 1800 weight parts of tri-functional epoxy resin "VG-3101", 4200 weight parts of bi-functional epoxy resin "EP-828EL" and 752 weight parts of TETA were added a predetermined amount of solvent and they were reacted with each other for predetermined hours while fully agitated. To the reactant product are added 36573 weight parts of 4.2 weight % acetic acid solution and 101 weight parts of coupling agent "Y-9138" to produce about 45 kg of binder having 15 weight % of solid component.

Glass fibers were bound to each other by the thus produced binder to produce glass fiber non-woven fabric having 11 weight % of binder adhesion and unit weight of 70 g/m$^2$.

Prepregs were produced by impregnating these glass fiber non-woven fabric with predetermined amount of epoxy resin and drying them. The prepregs were superimposed superposed one upon another and formed under heat and under pressure of 20 kgf/cm$^2$ for one hour to produce laminates having thickness of 1.2 mm.

EXAMPLE III

To 6000 weight parts of poly-functional epoxy resin "YDPN-638", 816 weight parts of TETA were added a predetermined amount of solvent and they were reacted with each other for predetermined hours while fully agitated. To the reactant product are added 36352 weight parts of 3.7 weight % acetic acid solution and 101 weight parts of coupling agent "Y-9138" to produce about 45 kg of binder having 15 weight % of solid component.

Glass fiber non-woven fabric and laminates were produced in the same manner as Example II.

PRIOR ART II

Binder was produced in the same manner as Example III except for 101 weight parts of coupling agent "Y-9138" of Example III replaced by 341 weight parts of coupling agent "A-187".

Glass fiber non-woven fabric and laminates were produced in the same manner as Example III.

COMPARISON OF EXAMPLES II AND III AND PRIOR ART II

Samples of laminates of Examples II and III and Prior Art II were provided for an anti-migration test. In this test, the laminates as samples have circuit patterns provided thereon at 0.3 mm of through-holes space and were placed at the atmosphere of 85° C. temperature and 85 % humidity with a voltage of DC 100 V applied across the circuits of the pattern.

Figure 2:
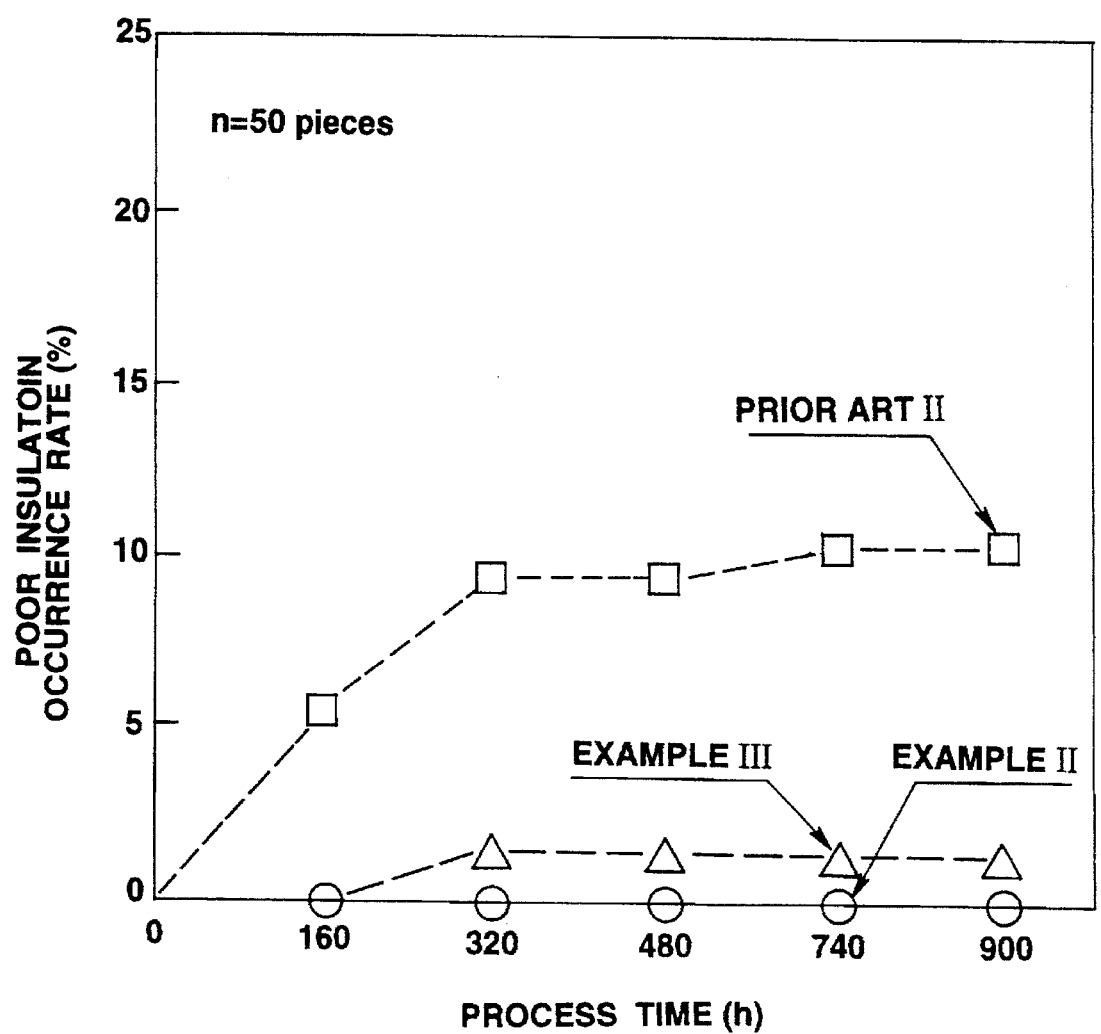
FIG. 2 illustrates in plot including curves poor insulation occurrence rate relative to process time in an anti-migration test of laminates.

The result of the test which evaluates anti-migration of the laminates is shown in FIG. 2 where there is illustrated poor insulation occurrence rate relative to process time in the anti-migration test.

The samples of Examples II and III and Prior Art II were provided for a pressure cooker process, which was made under pressure of 1 atm at a temperature of 121° C. The result which evaluates moisture resistance insulation characteristic of the laminates is shown in FIG. 3 where there is illustrated variation in electrical insulation relative to process time in the pressure cooker.

As noted from FIG. 2, the laminate of Example II had anti-migration more improved than those of Example III and Prior Art II.

Figure 3:
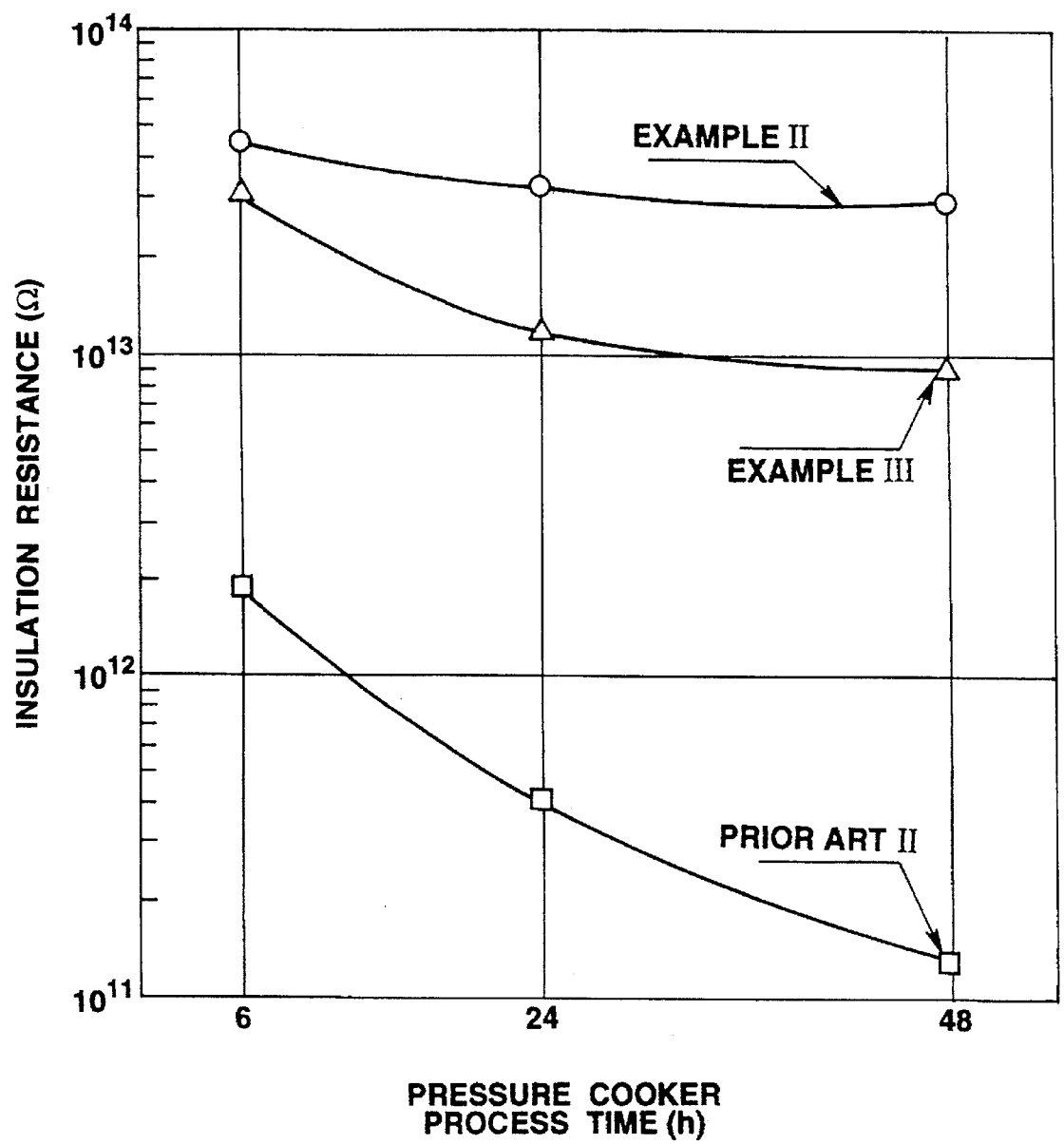
FIG. 3 illustrates in plot including curves variation in electrical insulation relative to process time in pressure cooker.

Also, as noted from FIG. 3, the laminates of Examples II and III had moisture resistance insulation characteristic more excellent than those of Prior Art II.

Although some examples of the invention have been illustrated and described with reference to the accompanying drawings, it will be understood by those skilled in the art that various changes and modifications may be made without departing from the spirit and scope of the invention, which is defined only to the appended claims.

What is claimed is:

1. Glass fiber non-woven fabric for use in forming a laminate to be impregnated with a thermosetting resin, said non-woven fabric comprising glass fibers bound to each other by epoxy binders including a phenyl amino-silane coupling agent having the formula:

$C_6H_5CH_2N^+H_2C_2H_4NHC_3H_6Si(OCH_3)_3Cl^-$.

2. Glass fiber non-woven fabric as set forth in claim 1, and wherein said epoxy binders include from 0.5 to 3% by weight of said phenyl amino-silane.

3. A method of producing glass fiber non-woven fabric for use in forming a laminate to be impregnated with a thermosetting resin, said non-woven fabric having glass fibers bound to each other by binders, comprising the steps of: forming said binders as a reactant product of a bi-functional epoxy resin and a tri-functional epoxy resin with an aliphatic amine having an acid added thereto, forming a mixture of said reactant product with a phenyl amino-silane coupling agent having the formula:

$C_6H_5CH_2N^+H_2C_2H_4NHC_3H_6Si(OCH_3)_3Cl^-$;

and contacting said fibers with said mixture to bind said fibers to each other and form said non-woven fabric.

4. A method of producing a laminate comprising the steps of preparing a multi-layer construction of base materials, impregnating said multi-layer construction of base materials with thermosetting resin and thereafter forming said multi-layer construction of base materials under heat and under pressure, said method characterized by preparing at least one portion of said base materials of glass fibers bound to each other by epoxy binders including phenylamino-silane coupling agent having the formula:

$$C_6H_5CH_2N^+H_2C_2H_4NHC_3H_6Si(OCH_3)_3Cl^-.$$

5. A method of producing a laminate comprising the steps of forming glass fiber non-woven fabric having glass fibers bound to each other, preparing prepregs by impregnating said glass fiber non-woven fabric with thermosetting resin and drying them and forming under heat and under pressure a multi-layer laminate of prepregs, at least one of said prepregs being prepared by reacting a bi-functional epoxy resin and a tri-functional epoxy resin and an aliphatic amine to form a reactant product having an acid added thereto, forming a mixture containing said reactant product and a phenyl amino-silane coupling agent having the formula:

$$C_6H_5CH_2N^+H_2C_2H_4NHC_3H_6Si(OCH_3)_3Cl^-;$$

and contacting said fibers with said mixture to bind said fibers to each other and form said non-woven fabric of said at least one prepreg.

* * * * *